US011460509B2

(12) United States Patent
Wu et al.

(10) Patent No.: US 11,460,509 B2
(45) Date of Patent: Oct. 4, 2022

(54) SYSTEM AND METHOD FOR DETECTING ELECTRODE TABS OF PACK FLEXIBLE PACKAGING BATTERY

(71) Applicant: WUHAN YIFI LASER CORP., LTD., Hubei (CN)

(72) Inventors: Xuan Wu, Hubei (CN); Conggui Cheng, Hubei (CN); Changlin Ran, Hubei (CN); Wuyue Xiong, Hubei (CN); Bo Lei, Hubei (CN)

(73) Assignee: WUHAN YIFI LASER CORP., LTD., Hubei (CN)

( * ) Notice: Subject to any disclaimer, the term of this patent is extended or adjusted under 35 U.S.C. 154(b) by 354 days.

(21) Appl. No.: 16/629,552

(22) PCT Filed: Aug. 15, 2017

(86) PCT No.: PCT/CN2017/097443
§ 371 (c)(1),
(2) Date: Jan. 8, 2020

(87) PCT Pub. No.: WO2019/010747
PCT Pub. Date: Jan. 17, 2019

(65) Prior Publication Data
US 2020/0174082 A1  Jun. 4, 2020

(30) Foreign Application Priority Data
Jul. 11, 2017 (CN) .......................... 201710560721.1

(51) Int. Cl.
*G01V 8/12* (2006.01)
*G01R 31/385* (2019.01)
(Continued)

(52) U.S. Cl.
CPC .......... *G01R 31/3865* (2019.01); *G01S 17/10* (2013.01); *G01V 8/12* (2013.01);
(Continued)

(58) Field of Classification Search
CPC ............ G01R 31/3865; H01M 10/052; H01M 50/531; G01V 8/12; G01S 17/10
See application file for complete search history.

(56) References Cited

U.S. PATENT DOCUMENTS

2015/0037626 A1\* 2/2015 Malcolm ............. H01M 10/613
429/90

FOREIGN PATENT DOCUMENTS

CN   201837369 U   5/2011
CN   105371758 A   3/2016
(Continued)

*Primary Examiner* — Kevin K Pyo
(74) *Attorney, Agent, or Firm* — Seed Intellectual Property Law Group LLP

(57) ABSTRACT

A system and method for detecting electrode tabs of a PACK flexible packaging battery relate to the field of PACK battery technologies. The system comprises a bus plate and a distance sensor, wherein through slots are disposed on the bus plate, and electrode tabs of a battery to be detected are inserted into the through slots during detection; and the distance sensor directly faces protruding portions of the electrode tabs of the battery to be detected after passing through the through slots, and is used for measuring the distance between the distance sensor and a protruding portion of an electrode tab nearest to the distance sensor.

10 Claims, 3 Drawing Sheets

(51) Int. Cl.
 *G01S 17/10* (2020.01)
 *H01M 10/052* (2010.01)
 *H01M 50/116* (2021.01)
 *H01M 50/531* (2021.01)

(52) U.S. Cl.
 CPC ....... *H01M 10/052* (2013.01); *H01M 50/116* (2021.01); *H01M 50/531* (2021.01)

(56) References Cited

FOREIGN PATENT DOCUMENTS

| | | |
|---|---|---|
| CN | 206208240 U | 5/2017 |
| JP | 2003-163008 A | 6/2003 |

\* cited by examiner

SYSTEM AND METHOD FOR DETECTING ELECTRODE TABS OF PACK FLEXIBLE PACKAGING BATTERY

CROSS-REFERENCE TO RELATED APPLICATION

The present application claims priority to Chinese Patent Application No. 2017105607211, filed on Jul. 11, 2017, entitled "System and Method for Detecting Electrode Tabs of PACK Flexible Packaging Battery", the disclosure of which is incorporated herein by reference in its entirety.

BACKGROUND

Technical Field

The present disclosure relates to the field of PACK batteries, and specifically to a system and method for detecting electrode tabs of a PACK flexible packaging battery.

Description of the Related Art

The flexible packaging battery refers to a lithium battery whose case is a flexible packaging material (generally as an aluminum compound packaging film), and has many advantages such as small volume, light weight, high specific energy, high safety performance, flexible design, and etc. A flexible packaging battery includes a battery body and electrode tabs including a positive electrode tab and a negative electrode tab which are respectively connected to the battery body. A single flexible packaging battery has a limited voltage capacity and cannot meet the user's needs. However, a PACK flexible packaging battery is a flexible packaging battery pack formed by packaging a plurality of single flexible packaging batteries through the PACK system, and has a large voltage capacity and charge and discharge function, which can meet the user's needs better. Packaging a plurality of single flexible packaging batteries into a PACK flexible packaging battery in a PACK system generally includes two key steps: stacking and soldering in which the stacking is to stack up a certain number of single flexible packaging batteries in order so as to form a flexible packaging battery pack for the subsequent soldering. During the production of a single flexible packaging battery, the case that the electrode tabs are missing due to the production process and quality control problems occurs. If a flexible packaging battery with missed electrode tabs is stacked into the flexible packaging battery pack during the stacking, allowing the flexible packaging battery pack with the missed electrode tabs to enter a subsequent process, especially the soldering process will cause serious accidents that the produced PACK batteries are not available, and etc.

At present, whether the electrode tabs of the stacked single flexible packaging battery are missing is detected in real time mainly by a manual visual checking method in the stacking process. However, using the manual visual checking method has a large workload and low detection efficiency, and the fatigue of human eyes will greatly reduce the detection accuracy, resulting in missed detection.

BRIEF SUMMARY

The embodiments of the present disclosure provide a system and method for detecting electrode tabs of a PACK flexible packaging battery, which can overcome the problems above or at least partially solve the problems above.

In one aspect, the embodiments of the present disclosure provide a system for detecting electrode tabs of a PACK flexible packaging battery, including a bus plate and distance sensors; wherein, through slots, into which electrode tabs of a battery to be detected are inserted during detection are provided on the bus plate; the distance sensors directly face protruding portions of the electrode tabs of the battery to be detected after passing through the through slots, and are configured to measure a distance between the distance sensors and a protruding portion of the electrode tab nearest to the distance sensors.

In an embodiment of the present disclosure, the distance sensors include two laser distance sensors disposed side by side; wherein two emitting surfaces of the two laser distance sensors directly face protruding portions of a positive electrode tab and a negative electrode tab of the battery to be detected after passing through the through slots, respectively.

In an embodiment of the present disclosure, the system further includes a battery supporting block disposed at one side of the bus plate and configured to support the battery to be detected.

In an embodiment of the present disclosure, the system further includes a robot arm configured to insert the electrode tabs of the battery to be detected into the through slots of the bus plate while placing the battery to be detected on the battery supporting block.

In an embodiment of the present disclosure, the system further includes an automatic linearly moving carrier plate one side of which is connected to the bus plate and the battery supporting block, and the other side thereof is connected to a lifting mechanism; wherein the automatic linearly moving carrier plate is configured to drive the bus plate and the battery supporting block to make linear lifting movement under the driving of the lifting mechanism.

In an embodiment of the present disclosure, the bus plate is connected to the automatic linearly moving carrier plate by means of a bus plate positioning support.

In an embodiment of the present disclosure, the lifting mechanism is connected to the automatic linearly moving carrier plate by means of bolts.

In another aspect, the embodiments of the present disclosure provide a method for detecting electrode tabs of a PACK flexible packaging battery using the system above, including:

S1, inserting electrode tabs of the battery to be detected into through slots of the bus plate;

S2, measuring a distance between the distance sensors and a protruding portion of an electrode tab nearest to the distance sensors by distance sensors, so as to obtain two distance values; and S3, determining whether the electrode tabs of the battery to be detected are missing based on the two distance values.

In an embodiment of the present disclosure, step S3 specifically includes:

determining the electrode tabs of the battery to be detected are not missing when both of the two distance values are smaller than or equal to a predetermined value; and determining the electrode tabs of the battery to be detected are missing when any of the two distance values is greater than the predetermined value.

In an embodiment of the present disclosure, following the step S3, the method further includes:

repeating steps S1-S2 when it is determined the electrode tabs of the battery to be detected are not missing until the stacking process ends; and removing the battery to be detected having missed electrode tabs to a returning area by the robot arm, when it is determined that the electrode tabs of a battery to be detected are missing.

By inserting electrode tabs of the battery to be detected into through slots of the bus plate, and then measuring the distance between the protruding portions of the electrode tabs after passing through the bus plate and the distance sensor using the distance sensors, the system and method for detecting electrode tabs of a PACK flexible packaging battery provided by an embodiment of the present disclosure can determine that whether electrode tab of the battery to be detected are missing, achieve the automatic detection regarding whether the electrode tabs of the PACK flexible packaging battery are missing in the stacking process, and has high detection accuracy.

DETAILED DESCRIPTION

In order to make the objectives, technical solutions and advantages of the embodiments of the present disclosure clearer, the technical solutions of the embodiments of the present disclosure will be described clearly with reference to the accompanying drawings hereinafter. Obviously, the described embodiments are merely some but not all of the embodiments of the present disclosure. On the basis of the embodiments of the present disclosure, all other embodiments obtained by the person of ordinary skill in the art without creative work shall fall within the protection scope of the present disclosure.

Figure 1:
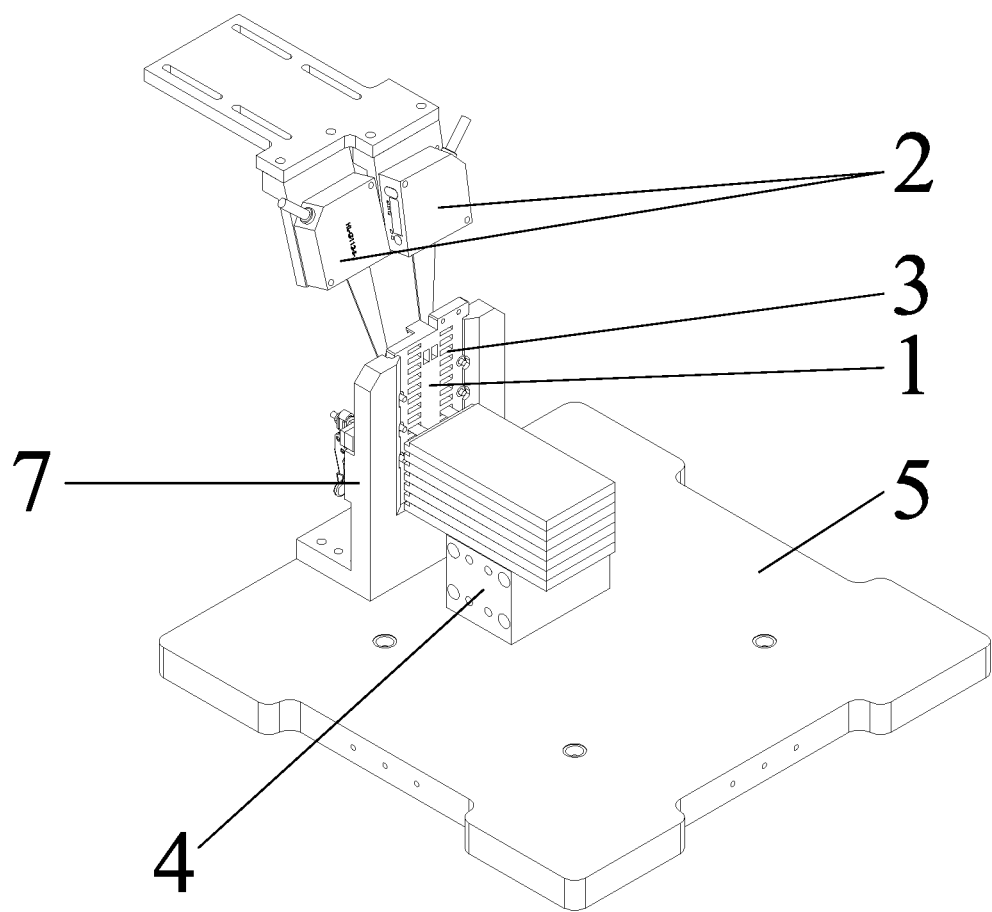
FIG. 1 is a structural diagram of the system for detecting electrode tabs of a PACK flexible packaging battery provided by an embodiment of the present disclosure.

FIG. 1 is a structural diagram of the system for detecting electrode tabs of a PACK flexible packaging battery provided by an embodiment of the present disclosure. As shown in FIG. 1, the system includes a bus plate 1 and distance sensors 2, wherein, through slots 3, into which electrode tabs of a battery to be detected are inserted during detection are provided on the bus plate 1; the distance sensors 2 directly face protruding portions of the electrode tabs of the battery to be detected after passing through the through slots 3, and are configured to measure the distance between the distance sensor 2 and a protruding portion of the electrode tab nearest to the distance sensors 2.

In an embodiment of the present disclosure, the through slots 3 are through holes matching the electrode tabs of the battery to be detected, and are generally disposed as rectangular through holes. The thickness of the bus plate 1 is smaller than the length of the electrode tabs of the battery to be detected. When the electrode tabs of the battery to be detected are inserted into the through slots 3, the electrode tabs of the battery to be detected have a portion of certain length protruding out of the through slot 3 if the electrode tabs of the battery to be detected are not missing. The distance sensors 2 are disposed as directly facing protruding portions of the electrode tabs of the battery to be detected after passing through the through slots 3, and can measure the distance between the distance sensors 2 and the protruding portion of the electrode tab nearest to the distance sensors 2. If the electrode tabs of the battery to be detected are not missing, the distance measured by the distance sensors 2 is equal to the distance between the through slots 3 through which the electrode tabs of the battery to be detected are inserted and the distance sensors 2, or the difference is within a specific range. If the electrode tabs of the battery to be detected are missing, the distance measured by the distance sensors 2 is the distance from the electrode tabs of the battery close to the battery to be detected, and this distance is greater than the distance between the through slots 3 through which the electrode tabs of the battery to be detected are inserted and the distance sensors 2. In summary, whether the electrode tabs of the battery to be detected are missing can be automatically determined by measuring the distance between the distance sensors 2 and the protruding portion of the electrode tab nearest to the distance sensors 2 through the distance sensors 2.

By inserting electrode tabs of the battery to be detected into through slots of the bus plate, and then measuring the distance between the protruding portions of the electrode tabs after passing through the bus plate and the distance sensors using the distance sensor according to the system for detecting electrode tab of PACK flexible packaging battery, it is determined that whether electrode tabs of the battery to be detected are missing, the automatic detection regarding whether the electrode tabs of the PACK flexible packaging battery are missing in the stacking process is realized, and high detection accuracy is also achieved.

In the embodiments above, the distance sensors 2 include two laser distance sensors disposed side by side. Two emitting surfaces of the two laser distance sensors respectively directly face the protruding portions of the positive electrode tabs and the negative electrode tab of the battery to be detected after passing through the through slots 3.

In an embodiment of the present disclosure, the working principle of the laser distance sensors is that, a laser diode firstly focuses on a target and emits a laser pulse, then the laser is reflected by the target and scatters in all directions. Part of the scattered light is returned to a sensor receiver, and received by an optical system and imaged onto an avalanche photodiode. The avalanche photodiode is an optical sensor with an internal amplification function, therefore it can detect extremely weak optical signals. The laser distance sensor records and processes the time spent from a time point at which light pulses are emitted and a time point at which the light pulses return and are received, thereby the distance to the target can be determined.

Two distance values $D_1$ and $D_2$ will be obtained by allowing the two emitting surfaces of the two laser distance sensors respectively to directly face the protruding portions of the positive electrode tabs and the negative electrode tabs of the battery to be detected after passing through the through slots. The two distance values are compared with the distance $D_0$ between the through slots 3 through which the electrode tabs of the battery to be detected are inserted and the distance sensors 2, when $D_1$ and $D_2$ are equal to $D_0$, or the difference is within a specific range, it is determined that the electrode tabs of the battery to be detected are not missing. When any one or two of $D_1$ and $D_2$ are greater than $D_0$, it is determined that the electrode tabs of the battery to be detected are missing. $D_1$ being greater than $D_0$ indicates that the positive electrode tab of the battery to be detected is missing; $D_2$ being greater than $D_0$ indicates that the negative electrode tab of the battery to be detected is missing; both of $D_1$ and $D_2$ being greater than $D_0$ indicates that the positive electrode tab and the negative electrode tab of the battery to be detected are missing.

By providing two laser distance sensors, it is determined that whether the positive electrode tab and the negative electrode tab of the battery to be detected are missing, respectively, thereby recording the probability of missing of various electrode tabs, and providing guidance for the single battery production in the early stage.

In the embodiments above, the system further includes a battery supporting block 4 disposed at one side of the bus plate and configured to support the batteries to be detected.

In the embodiments above, the system further includes a robot arm configured to insert the electrode tabs of the battery to be detected into the through slots of the bus plate while placing the battery to be detected on the battery supporting block 4.

Figure 2:
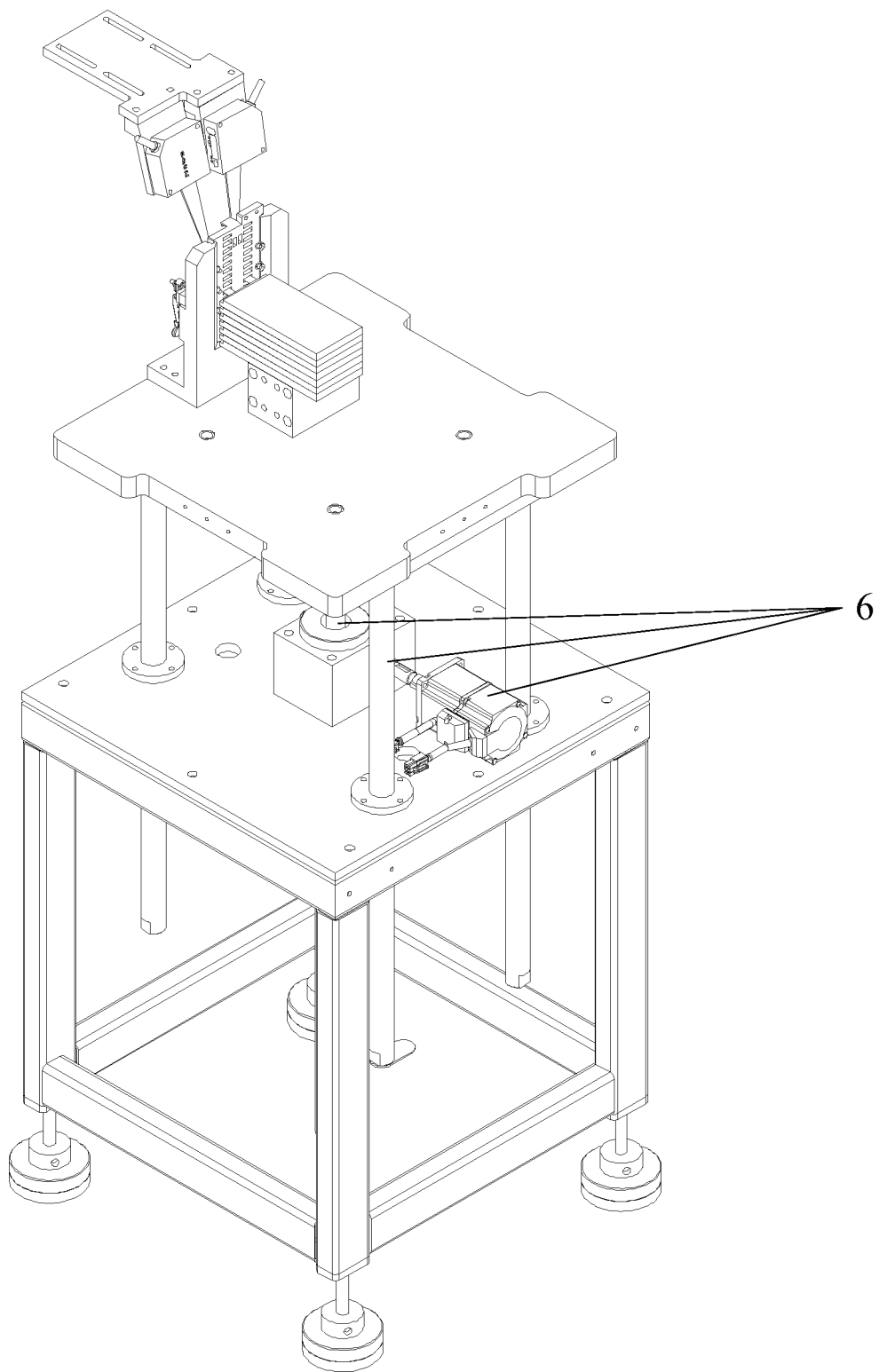
FIG. 2 is a structural diagram of another system for detecting electrode tabs of a PACK flexible packaging battery provided by an embodiment of the present disclosure.

In the embodiments above, as shown in FIG. 2, the system further includes an automatic linearly moving carrier plate 5 one side of which is connected to the bus plate 1 and the battery supporting block 4, and the other side thereof is connected to a lifting mechanism 6. The automatic linearly moving carrier plate 5 is configured to drive the bus plate 1 and the battery supporting block 4 to make linear lifting movement under the driving of the lifting mechanism 6.

In an embodiment of the present disclosure, the battery supporting block 4 allows the electrode tabs of the battery to be detected to directly face the through slots 3 on the bus plate 1 in the stacking process. Optionally, the electrode tabs of the first battery to be detected directly face the through slots 3 nearest to the automatic linearly moving carrier plate 5 of the bus plate 1. When it is detected and determined that electrode tabs of a battery to be detected are not missing, the lifting mechanism 6 drives the bus plate 1 and the battery supporting block 4 on the automatic linearly moving carrier plate 5 to descend by a distance of the thickness of one battery, so as to ensure that the distance $D_0$ between the two laser distance sensors and the through slots through which the electrode tabs of the battery to be detected are inserted during the stacking process is constant.

In the embodiments above, the bus plate 1 is connected to the automatic linearly moving carrier plate 5 through a bus plate positioning support 7.

In the embodiments above, the lifting mechanism 6 is connected to the automatic linearly moving carrier plate 5 by means of bolts.

When the stacking process ends, the lifting mechanism 5 drives the automatic linearly moving carrier plate 5 to descend until the two sides of the automatic linearly moving carrier plate 5 are in contact with an automatic line track, since the lifting mechanism 6 is connected to the automatic linearly moving carrier plate 5 through bolts, the automatic linearly moving carrier plate 5 is separated from the lifting mechanism 6, and the automatic line track carries the automatic linearly moving carrier plate 5 into the next process.

Figure 3:
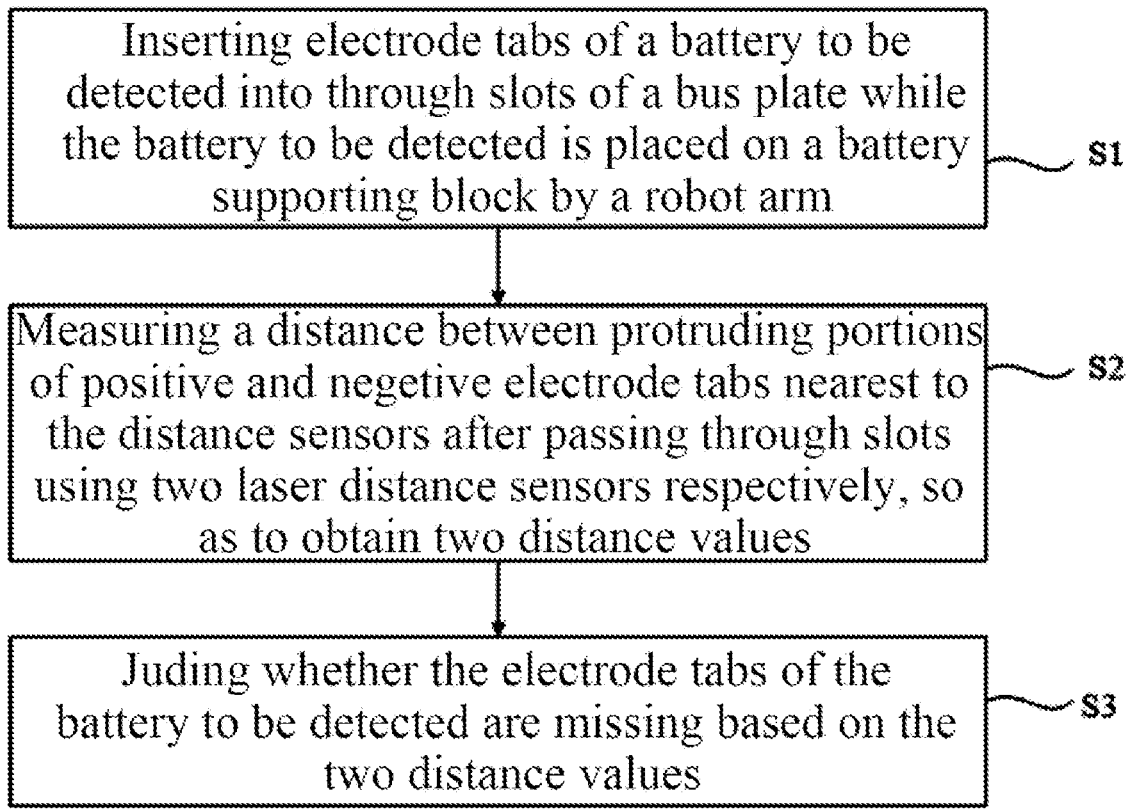
FIG. 3 is a flow chart of the method for detecting electrode tabs of a PACK flexible packaging battery provided by an embodiment of the present disclosure.

FIG. 3 is a flow chart of the method for detecting electrode tabs of a PACK flexible packaging battery provided by an embodiment of the present disclosure, as shown in FIG. 3, the method includes:

S1, inserting electrode tabs of the battery to be detected into through slots of the bus plate; S2, measuring the distance between the distance sensors and a protruding portion of an electrode tab nearest to the distance sensors by the distance sensors, so as to obtain two distance values; S3, determining whether the electrode tabs of the battery to be detected are missing based on the two distance values.

In an embodiment of the present disclosure, the working principle of the laser distance sensors is that, a laser diode firstly focuses on the target and emits a laser pulse, then the laser is reflected by the target and scatters in all directions. Part of the scattered light is returned to a sensor receiver, and received by an optical system and imaged onto an avalanche photodiode. The avalanche photodiode is an optical sensor with an internal amplification function, therefore it can detect extremely weak optical signals. The laser distance sensor records and processes the time spent from a time point at which light pulses are emitted and a time point at which the light pulses return and are received, thereby the distance to the target can be determined.

The through slots are through holes matching the electrode tabs of the battery to be detected, and are generally disposed as rectangular through holes. The thickness of the bus plate is smaller than the length of the electrode tabs of the battery to be detected. When the electrode tabs of the battery to be detected are inserted into the through slot, the electrode tabs of the battery to be detected have a portion of certain length protruding out of the through slot if the electrode tabs of the battery to be detected are not missing. The distance sensors are disposed as directly facing protruding portions of the electrode tabs of the battery to be detected after passing through the through slots, and can measure the distance between the distance sensor and the protruding portion of the electrode tab nearest to the distance sensor. If the electrode tabs of the battery to be detected are not missing, the distance measured by the distance sensors is equal to the distance between the through slot through which the electrode tabs of the battery to be detected are inserted and the distance sensors, or the difference is within a specific range. If the electrode tabs of the battery to be detected are missing, the distance measured by the distance sensors is the distance from the electrode tabs of the battery close to the battery to be detected, and this distance is greater than the distance between the through slot through which the electrode tabs of the battery to be detected are inserted and the distance sensors.

Further, when it is detected and determined that electrode tabs of a battery to be detected are not missing, the lifting mechanism drives the bus plate and the battery supporting block on the automatic linearly moving carrier plate to descend by a distance of the thickness of one battery, so as to ensure that the distance $D_0$ between the two laser distance sensors and the through slots through which the electrode tabs of the battery to be detected are inserted during the stacking process is constant.

By inserting electrode tabs of the battery to be detected into through slots of the bus plate, and then measuring the distance between the protruding portions of the electrode tabs after passing through the bus plate and the distance sensors using the distance sensors according to the method for detecting electrode tab of PACK flexible packaging battery, it is determined whether electrode tabs of the battery to be detected are missing, the automatic detection regarding whether the electrode tabs of the PACK flexible packaging battery are missing is realized, and high detection precision is achieved.

In the embodiments above, step S3 specifically includes:
determining the electrode tabs of the battery to be detected are not missing when both of the two distance values are smaller than or equal to a predetermined value;

determining the electrode tabs of the battery to be detected are missing when any of the two distance values is greater than the predetermined value.

In an embodiment of the present disclosure, two distance values $D_1$ and $D_2$ will be obtained by allowing the two emitting surfaces of the two laser distance sensors respectively to directly face the protruding portions of the positive electrode tabs and the negative electrode tabs of the battery to be detected after passing through the through slots. Two distance values are compared with the distance $D_0$ between the through slots through which the electrode tabs of the battery to be detected are inserted and the distance sensors, when $D_1$ and $D_2$ are equal to $D_0$, or the difference is within a specific range, it is determined that the electrode tabs of the battery to be detected is determined are not missing. When any one or two of $D_1$ and $D_2$ are greater than $D_0$, it is determined that the electrode tabs of the battery to be detected are missing. $D_1$ being greater than $D_0$ indicates that the positive electrode tab of the battery to be detected is missing; $D_2$ being greater than $D_0$ indicates that the negative electrode tab of the battery to be detected is missing; both of $D_1$ and $D_2$ being greater than $D_0$ indicates that the positive electrode tab and the negative electrode tab of the battery to be detected are missing.

By providing two laser distance sensors, it is determined that whether the positive electrode tab and the negative electrode tab of the battery to be detected are missing, respectively, thereby recording the probability of missing of various electrode tabs, and providing guidance for the battery production in the early stage.

In the embodiments above, after step S3 the method further includes:

repeating steps S1-S2 when it is determined the electrode tabs of the battery to be detected are not missing until the stacking process ends; and removing the battery to be detected having missed electrode tabs to a returning area by the robot arm, when it is determined that the electrode tabs of a battery to be detected are missing.

When the stacking process ends, the lifting mechanism drives the automatic linearly moving carrier plate to descend until the two sides of the automatic linearly moving carrier plate are in contact with an automatic line track, since the lifting mechanism is connected to the automatic linearly moving carrier plate through bolts, the automatic linearly moving carrier plate is separated from the lifting mechanism, and the automatic line track carries the automatic linearly moving carrier plate into the next process.

Finally, it should be noted that the embodiments above are only used to illustrate rather than to limit the technical solutions of the present disclosure; although the present disclosure has been described in detail with reference to the foregoing embodiments, those of ordinary skills in the art should understand that they can still modify the technical solutions described in the foregoing embodiments, or equivalently replace some of the technical features therein; and these modifications or replacements do not separate the essence of the corresponding technical solutions from the spirit and scope of the technical solutions of each of the embodiments of the present disclosure.

The invention claimed is:

1. A system for detecting electrode tabs of a PACK flexible packaging battery, comprising a bus plate and distance sensors; wherein through slots, into which electrode tabs of a battery to be detected are inserted during detection are provided on the bus plate; the distance sensors directly face protruding portions of the electrode tabs of the battery to be detected after passing through the through slots, and are configured to measure a distance between the distance sensor and a protruding portion of the electrode tab nearest to the distance sensor.

2. The system of claim 1, wherein the distance sensor includes two laser distance sensors disposed side by side; wherein two emitting surfaces of the two laser distance sensors directly face protruding portions of a positive electrode tab and a negative electrode tab of the battery to be detected after passing through the through slots, respectively.

3. The system of claim 1, further comprising a battery supporting block disposed at one side of the bus plate and configured to support the battery to be detected.

4. The system of claim 3, further comprising a robot arm configured to insert the electrode tabs of the battery to be detected into the through slots of the bus plate while placing the battery to be detected on the battery supporting block.

5. The system of claim 3, further comprising an automatic linearly moving carrier plate; wherein one side of the automatic linearly moving carrier plate is connected to the bus plate and the battery supporting block, and the other side is connected to a lifting mechanism; wherein the automatic linearly moving carrier plate is configured to drive the bus plate and the battery supporting block to make linear lifting movement under the driving of the lifting mechanism.

6. The system of claim 5, wherein the bus plate is connected to the automatic linearly moving carrier plate by means of a bus plate positioning support.

7. The system of claim 5, wherein the lifting mechanism is connected to the automatic linearly moving carrier plate by means of bolts.

8. A method for detecting electrode tabs of a PACK flexible packaging battery using the system of claim 1, comprising:

S1, inserting electrode tabs of the battery to be detected into through slots of the bus plate;

S2, measuring a distance between the distance sensor and a protruding portion of an electrode tab nearest to the distance sensor by the distance sensors, so as to obtain two distance values; and S3, determining whether the electrode tabs of the battery to be detected is missing based on the two distance values.

9. The method of claim 8, wherein the step S3 specifically comprises:

determining the electrode tabs of the battery to be detected are not missing when both of the two distance values are smaller than or equal to a predetermined value; and determining the electrode tab of the battery to be detected is missing when any of the two distance values is greater than the predetermined value.

10. The method of claim 8, wherein following the step S3, further comprising:

repeating steps S1-S2 when it is determined the electrode tabs of the battery to be detected are not missing until a stacking process ends;

removing the battery to be detected having missed electrode tabs to a returning area by a robot arm, when it is determined that the electrode tabs of a battery to be detected are missing.

* * * * *